United States Patent [19]
Choi

[11] Patent Number: 5,812,575
[45] Date of Patent: Sep. 22, 1998

[54] SEMICONDUCTOR LASER DIODE

[75] Inventor: Won-Jin Choi, Kyungki-do, Rep. of Korea

[73] Assignee: LG Semicon Co., Ltd., Chungcheongbuk-Do, Rep. of Korea

[21] Appl. No.: 698,097

[22] Filed: Aug. 15, 1996

[30] Foreign Application Priority Data

Aug. 25, 1995 [KR] Rep. of Korea ........... 1995 26662

[51] Int. Cl.⁶ ........................................... H01S 3/19
[52] U.S. Cl. ............................................... 372/45
[58] Field of Search ................ 372/45, 46; 257/13, 257/18

[56] References Cited

U.S. PATENT DOCUMENTS 5,521,935  5/1996  Irikawa ........................ 372/45
5,559,818  9/1996  Shono et al. .................. 372/45

*Primary Examiner*—James W. Davie
*Attorney, Agent, or Firm*—John P. White; Cooper & Dunham LLP

[57] ABSTRACT

Semiconductor laser diode in which an SCL (Strain Compensated Layer) is formed at an active layer of a 635 nm band semiconductor laser diode for having very low threshold current, is disclosed, including a first conduction type clad layer; a first optical guide layer; a strain compensated layer; an active layer having a strain applied thereto; a strain compensated layer; a second optical guide layer; and, a second conduction type clad layer, wherein the above layers are formed on a first conduction type substrate in succession.

3 Claims, 4 Drawing Sheets convention art convention art

SEMICONDUCTOR LASER DIODE

BACKGROUND OF THE INVENTION

1. Field of the Invention

The present invention relates to a semiconductor laser diode, and more particularly, to a semiconductor laser diode in which an SCL (Strain Compensated Layer) is formed at an active layer of a 635 nm band semiconductor laser diode for having very low threshold current.

2. Discussion of the Related Art

Recently, many semiconductor laser diode structures are adopted in which strains are put on their active layers during fabrication for obtaining lower threshold currents.

FIG. 1 illustrates an active layer of a conventional 635 nm band semiconductor laser diode. As shown, the 635 nm band laser diode has an active layer having a single (or multiple) quantum well(s) to which a tensile strain has been applied.

FIG. 2 illustrates threshold current values of the 635 nm band laser diode versus number of the quantum wells of the active layer to which a tensile strain has been applied. Referring to FIG. 2, it can be seen in the 635 nm band laser diode that a laser diode of a single quantum well has a threshold current lower the threshold current of a laser diode of multiple quantum wells. Therefore, it is favorable to adopt the single quantum well for an active layer of a laser diode. However, because of the reduction of an optical confinement factor coming from the application of a tensile strain to the active layer of the laser diode which lowers a refractive index difference between a positive optical guide layer and a quantum well layer, and the low injection rate of holes into the quantum well coming from the high aluminum composition ratio ($x \geq 0.5$) of the positive optical guide layer, the laser diode of FIG. 1 has a limitation in lowering the threshold current value of the laser diode any further.

SUMMARY OF THE INVENTION

Accordingly, the present invention is directed to a semiconductor laser diode that substantially obviates one or more of the problems due to limitations and disadvantages of the related art.

An object of the present invention is to provide a semiconductor laser diode which can lower a threshold current further.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the semiconductor laser diode includes a first conduction type clad layer, a first optical guide layer, a strain compensated layer, an active layer having a strain applied thereto, a strain compensated layer, a second optical guide layer and a second conduction type clad layer, formed on a first conduction type substrate in succession.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF THE PREFERRED EMBODIMENT

Reference will now be made in detail to the preferred embodiments of the present invention, examples of which are illustrated in the accompanying drawings.

Figure 1:
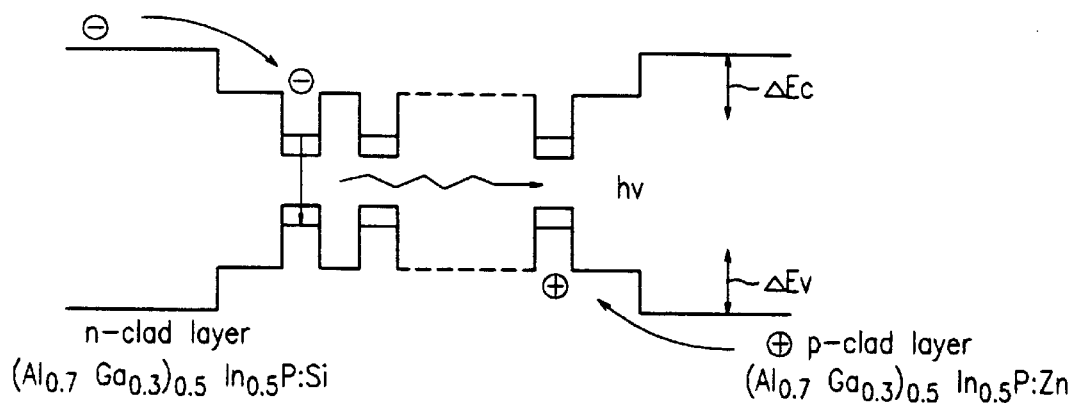
FIG. 1 illustrates an active layer of a conventional 635 nm band semiconductor laser diode.
Figure 2:
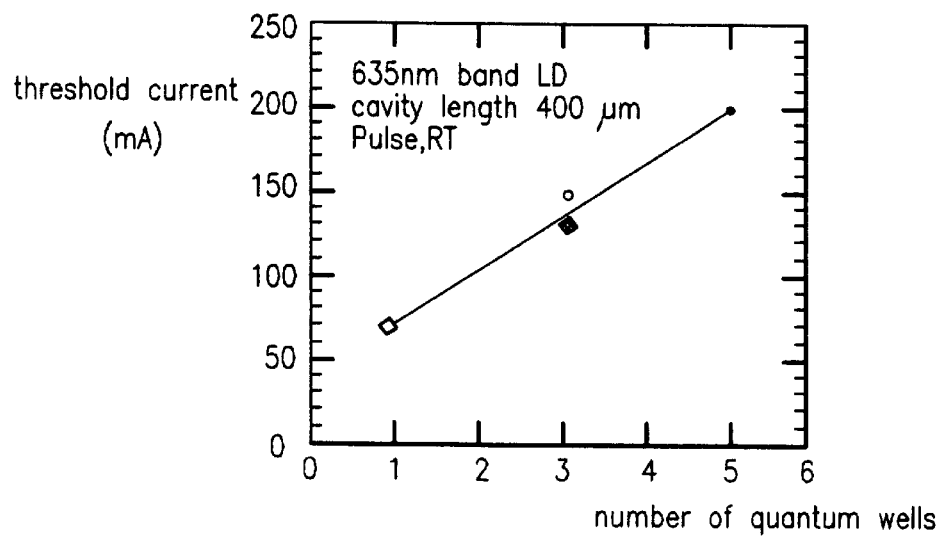
FIG. 2 illustrates threshold current value of a conventional 635 nm band laser diode versus number of quantum wells of an active layer to which a tensile strain has been applied.
Figure 3:
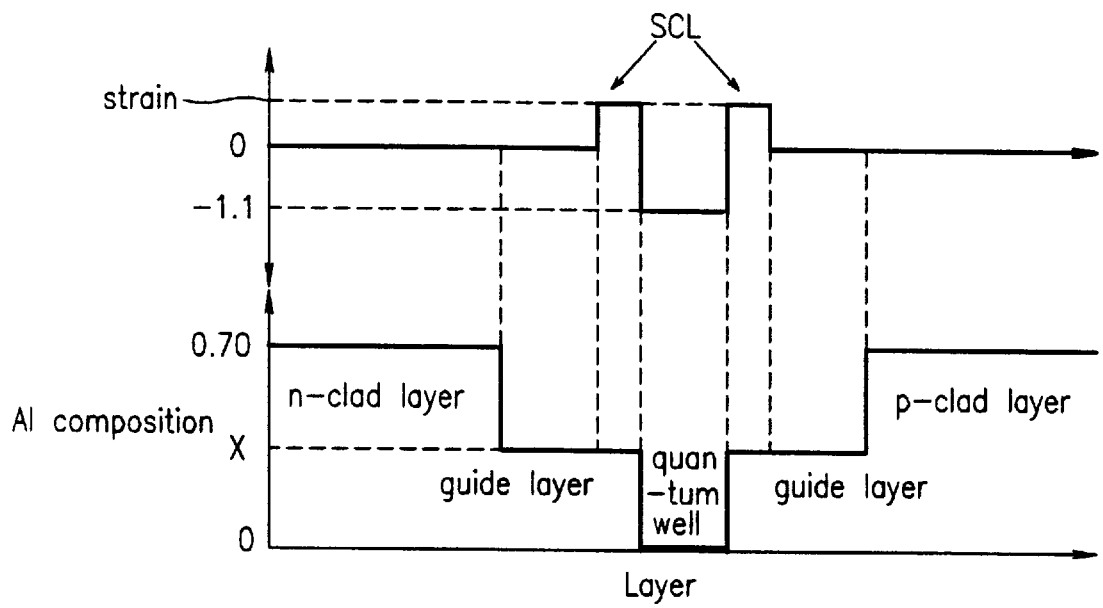
FIG. 3 illustrates a structure of a 635 nm band laser diode having a strain compensated layer in accordance with one preferred embodiment of the present invention.

Shown in FIG. 3 is a structure of a 635 nm band laser diode having an SCL (Strain Compensated Layer) in accordance with one preferred embodiment of the present invention.

Referring to FIG. 3, the SCL is formed at an interface between an optical guide layer and a single quantum well layer to a thickness of about 1 nm to 20 nm. A strain of the SCL and a strain of the quantum well layer carry opposite polarities to each other(for example, +strain of the SCL vs. −strain of the quantum well layer, or −strain of the SCL vs. +strain of the quantum well layer). A magnitude of strain of the SCL is varied depending on a magnitude of strain of the quantum well taking problems in growth of a thin film and a refractive index difference between the quantum well layer and the SCL into account. In the present invention, the magnitude of strain of the SCL and the magnitude of strain of the quantum well layer are set to be +0.3% and −0.1%, respectively.

The advantages of forming the SCL is as follows.

Figure 4:
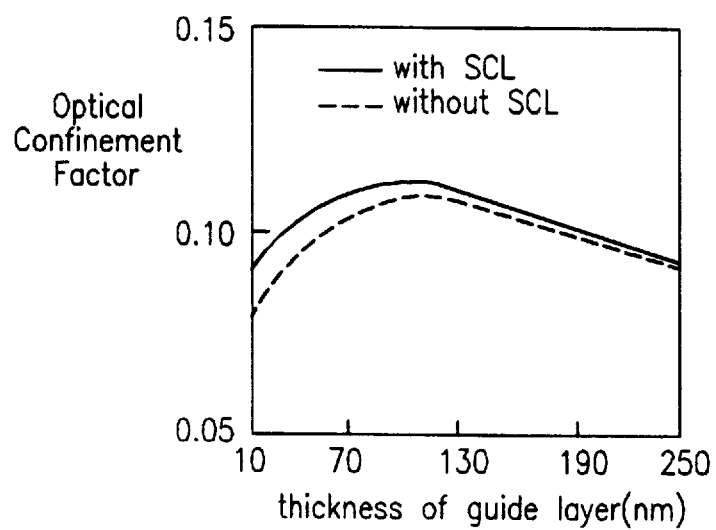
FIG. 4 illustrates graphs showing magnitudes of optical confinement factors for the cases when a strain compensated layer is, and is not formed, respectively.

FIG. 4 illustrates graphs showing magnitudes of optical confinement factors for the cases when a strain compensated layer is, and is not formed, respectively, in which it can be known that the optical confinement factor of the case when the SCL is formed is generally increased. This means that an optical loss can be reduced that much.

Figure 5:
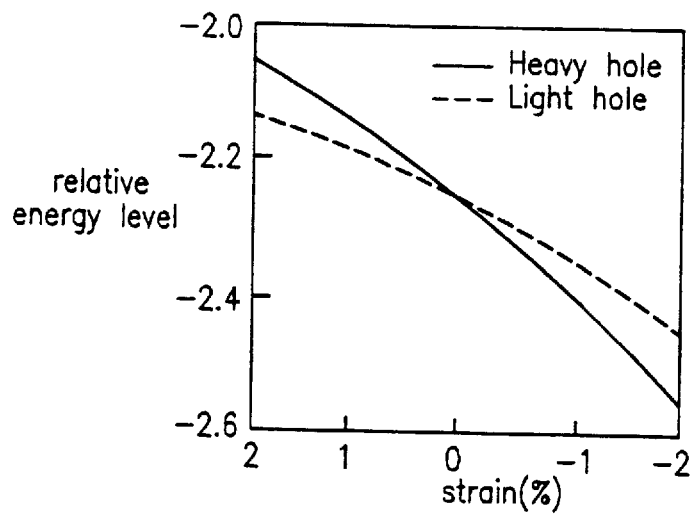
FIG. 5 illustrates graphs showing energy levels of a heavy hole band and a light hole band respectively at a valence band edge with reference to a conduction band edge of which energy level is taken to be 0.

FIG. 5 illustrates graphs showing energy levels of a heavy hole band and a light hole band respectively at a valence band edge with reference to a conduction band edge at which K=0 in (E and K) spaces. In case there is no strain, the heavy hole band and the light hole band in a valence band are degenerated. However, upon application of a strain, the heavy hole band and the light hole band are split and the degeneracy is broken. This means that, in case of a hole conduction, the carrier-carrier scattering is reduced that much. Since an effective mass of a hole is reduced the more as strain is applied the more in view of the Luttinger hamiltonian, it can be known that the SCL of the present invention increases a mobility of the hole, to make injection of holes into the active layer in the quantum well better.

Figure 6:
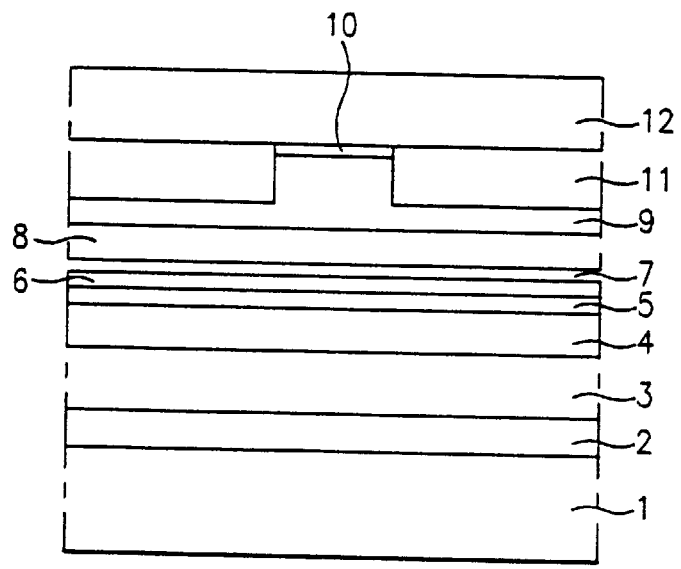
FIG. 6 illustrates a section of a semiconductor laser diode in accordance with one preferred embodiment of the present invention.

FIG. 6 illustrates a section of a 635 nm band index guide type semiconductor laser diode in accordance with the present invention. A method for fabricating the 635 nm band semiconductor laser diode in accordance with the present invention will be explained.

An $n^+$-GaAs buffer layer ($n \cong 1 \times 10^{18}$ cm$^{-3}$, thickness; 0.3 $\mu$m) 2, an n-$(Al_{0.7}Ga_{0.3})_{0.5}In_{0.5}P$ clad layer ($n \cong 5 \times 10^{18}$ cm$^{-3}$, thickness; 1 $\mu$m) 3, an undoped $(Al_xGa_{1-x})_{0.5}In_{0.5}P$ guide layer ($0.4 \leq x \leq 0.55$, thickness; 100 Å–1500 Å) 4, an undoped $(Al_{x'}Ga_{1-x'})_{0.5-\delta}In_{0.5+\delta}P$ SCL ($0.4 \leq x' \leq 0.55$, $0.05 \leq \delta \leq 0.1$) 5, an undoped $Ga_{0.65}In_{0.35}P$ quantum well layer (thickness: 300 Å) 6, an undoped $(Al_{x'}Ga_{1-x'})_{0.5-\delta}In_{0.5+\delta}P$ SCL 7, undoped $(Al_xGa_{1-x})_{0.5}In_{0.5}P$ guide layer 8, a p-$(Al_{0.7}Ga_{0.3})_{0.5}In_{0.5}P$ clad layer ($p \cong 1 \times 10^{18}$ cm$^{-3}$, thickness; 1 $\mu$m) 9, and a p-$Ga_{0.5}In_{0.5}P$ current contacting buffer layer 10, are grown for the first time on an $n^+$-GaAs substrate 1 in succession. Then, appropriate ridges are formed on an entire resultant surface by means of photolithography, and an n-GaAs current blocking layer 11 is re-grown for the second time thereon. And, a p-GaAs electrode layer 12 is re-grown for the third time thereon, thereby to complete fabrication of an laser diode.

Figure 7A:
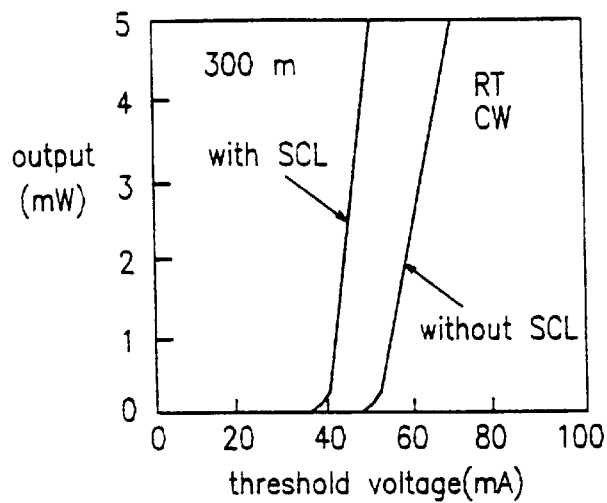
FIG. 7 illustrates a current-optical output characteristics of a semiconductor laser diode in accordance with the present invention; and, FIG. 8 illustrates a section of a 635 nm band gain guide type laser diode in accordance with another preferred embodiment of the present invention.
Figure 7B:
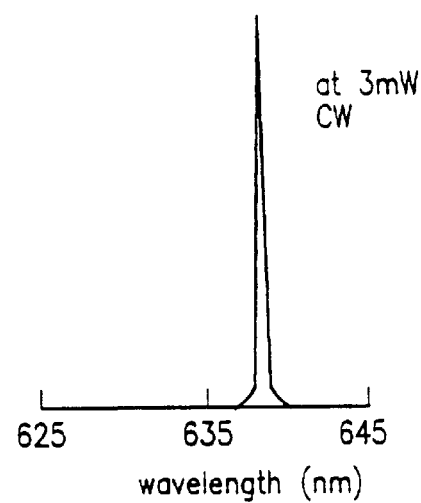

Illustrated in FIG. 7 is a current-optical output characteristics of a 635 nm band semiconductor laser diode having an SCL fabricated through the aforementioned process, wherein the current-optical output characteristics of a 635 nm band semiconductor laser diode having no SCL is included for comparison purpose. As shown, in case of the laser diode with no SCL, an oscillation starting current was about 50 mA at a resonance wavelength of 300 $\mu$m. On the other hand, in case of the laser diode with the SCL, the oscillation starting current was about 40 mA at a resonance wavelength of 300 $\mu$m, which is an 20% improvement in the threshold current value.

Figure 8:
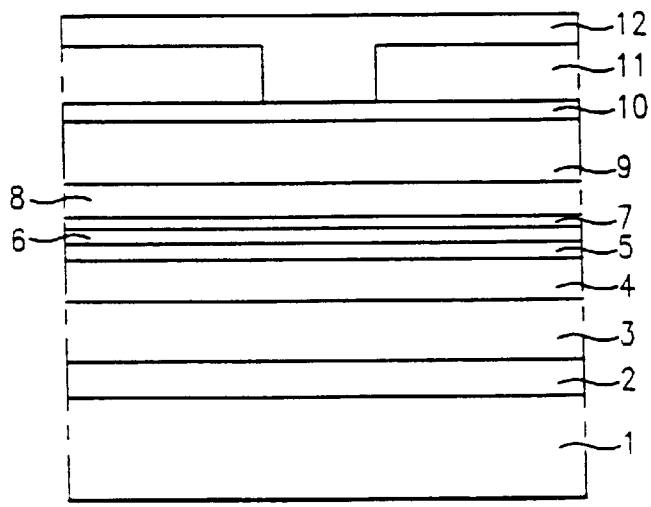

FIG. 8 illustrates a section of a 635 nm band gain guide type laser diode in accordance with another preferred embodiment of the present invention.

An $n^+$-GaAs buffer layer ($n \cong 1 \times 10^{18}$ cm$^{-3}$, thickness; 0.3 $\mu$m) 2, an n-$(Al_{0.7}Ga_{0.3})_{0.5}In_{0.5}P$ clad layer ($n \cong 5 \times 10^{18}$ cm$^{-3}$, thickness; 1 $\mu$m) 3, an undoped $(Al_xGa_{1-x})_{0.5}In_{0.5}P$ guide layer ($0.4 \leq x \leq 0.55$, thickness; 100 Å–1500 Å) 4, an undoped $(Al_{x'}Ga_{1-x'})_{0.5-\delta}In_{0.5+\delta}P$ SCL ($0.4 \leq x' \leq 0.55$, $0.05 \leq \delta \leq 0.1$) 5, an undoped $Ga_{0.63}In_{0.37}P$ quantum well layer (thickness: 300 Å) 6, an undoped $(Al_{x'}Ga_{1-x'})_{0.5-\delta}In_{0.55+\delta}P$ SCL 7, undoped $(Al_xGa_{1-x})_{0.5}In_{0.5}P$ guide layer 8, a p-$(Al_{0.7}Ga_{0.3})_{0.5}In_{0.5}P$ clad layer ($p \cong 1 \times 10^{18}$ cm$^{-3}$, thickness; 1 $\mu$m) 9, a p-$Ga_{0.5}In_{0.5}P$ current contacting buffer layer 10, and an n-GaAs current blocking layer 11, are grown for the first time on an $n^+$-GaAs substrate 1 in succession. Then, the n-GaAs current blocking layer 11 is subjected to photolithography for patterning the layer 11 into a predetermined pattern. And, a p-GaAs electrode layer 12 is re-grown for the second time thereon, thereby to complete fabrication of an laser diode.

As has been explained, by forming an SCL at an active layer of a semiconductor laser diode, the present invention allows to provide a high quality semiconductor laser diode having very low threshold current value.

It will be apparent to those skilled in the art that various modifications and variations can be made in method for fabricating semiconductor device of the present invention without departing from the spirit or scope of the invention. Thus, it is intended that the present invention cover the modifications and variations of this invention provided they come within the scope of the appended claims and their equivalents.

What is claimed is:

1. A semiconductor laser diode comprising:
   a first conduction type clad layer;
   a first optical guide layer;
   a first strain compensated layer;
   a single quantum well active layer having a strain applied thereto;
   a second strain compensated layer;
   a second optical guide layer; and,
   a second conduction type clad layer, wherein the above layers are formed on a first conduction type substrate in succession and said strain opposite to the active layer is applied to each of the strain compensated layers and to at least one of the first and second strain compensated layers and at least –1.0% of said strain is applied to the active layer.

2. A semiconductor laser diode comprising:
   a first conduction type buffer layer;
   a first conduction type clad layer;
   a first optical guide layer;
   a first strain compensated layer;
   a single quantum well active layer having a strain applied thereto;
   a second strain compensated layer;
   a second optical guide layer;
   a second conduction type clad layer;
   a second conduction type current contacting buffer layer;
   a first conduction type current blocking layer; and,
   a second conduction type electrode layer,
   wherein the above layers are formed on a first conduction type substrate in succession.

3. A semiconductor laser diode as claimed in claim 2, wherein a 0.3% of the strain is applied to at least one of the first and second strain compensated layers and at least –1.0% of the strain is applied to the active layer.

* * * * *